United States Patent
Tanabe et al.

(10) Patent No.: US 7,943,849 B2
(45) Date of Patent: May 17, 2011

(54) PHOTOELECTRIC CONVERSION DEVICE

(75) Inventors: Junji Tanabe, Tokyo (JP); Masahiro Tsuchiya, Tokyo (JP); Hidenori Shinohara, Tokyo (JP); Atsushi Monden, Tokyo (JP); Masahiro Shinkai, Tokyo (JP); Tokuhiko Handa, Tokyo (JP)

(73) Assignee: TDK Corporation, Tokyo (JP)

( * ) Notice: Subject to any disclaimer, the term of this patent is extended or adjusted under 35 U.S.C. 154(b) by 276 days.

(21) Appl. No.: 12/078,154

(22) Filed: Mar. 27, 2008

(65) Prior Publication Data

US 2008/0236663 A1 Oct. 2, 2008

(30) Foreign Application Priority Data

Mar. 30, 2007 (JP) ................. 2007-091220
Mar. 13, 2008 (JP) ................. 2008-063818

(51) Int. Cl.
*H01L 31/00* (2006.01)
*H01L 31/042* (2006.01)
*H01L 29/08* (2006.01)
*H01L 29/12* (2006.01)
*H01L 27/14* (2006.01)

(52) U.S. Cl. ........ 136/263; 136/250; 136/252; 136/256; 257/40; 257/43; 257/431

(58) Field of Classification Search .................. 136/252, 136/263, 256, 250; 438/73; 427/74; 429/111; 257/40, 43, 431
See application file for complete search history.

(56) References Cited

FOREIGN PATENT DOCUMENTS

| EP | 1020881 | * | 1/2000 |
| EP | 1293997 | * | 9/2002 |
| JP | A-2000-294303 | | 10/2000 |

OTHER PUBLICATIONS

Xiuyinh Chen, Novel cyanine dyes with different methine chains as sensitizers for nanocrystalline solar cell, Journal of Photochemistry and Photobiology A: Chemistry 171 (2005) 231-236.*

* cited by examiner

*Primary Examiner* — Ling-Siu Choi
*Assistant Examiner* — Monique Peets
(74) *Attorney, Agent, or Firm* — Oliff & Berridge, PLC

(57) ABSTRACT

Provided is a photoelectric conversion device capable of improving a conversion efficiency. In a dye-sensitized photoelectric conversion device including a working electrode and a facing electrode, and an electrolyte inclusion, a dye is carried on a metal-oxide semiconductor layer of the working electrode. The dye includes cyanine dye having a benzyl group and an indolenine skeleton. Therefore, crystallization of the dye on the surface of the metal-oxide semiconductor layer is suppressed.

7 Claims, 1 Drawing Sheet

PHOTOELECTRIC CONVERSION DEVICE

CROSS REFERENCES TO RELATED APPLICATIONS

The present invention contains subject matter related to Japanese Patent Applications JP 2007-091220 and JP 2008-63818 filed in the Japanese Patent Office on Mar. 30, 2007 and Mar. 13, 2008, respectively, the entire contents of which being incorporated herein by reference.

BACKGROUND OF THE INVENTION

1. Field of the Invention

The present invention relates to a photoelectric conversion device using a dye.

2. Description of the Related Art

As a photoelectric conversion device such as a solar cell converting light energy such as sunlight into electric energy, there has been known a dye-sensitized photoelectric conversion device using an electrode which has an oxide semiconductor and carries a dye to be sensitized. This dye-sensitized photoelectric conversion device is thought to be theoretically promising in terms of high efficiency, and costly very advantageous in comparison with a commonly spread photoelectric conversion device using a silicon semiconductor. Thus, the dye-sensitized photoelectric conversion device has attracted attention as the photoelectric conversion device in the next generation, and the development for practical use has been in progress.

In the dye used for the dye-sensitized photoelectric conversion device, for the purpose of improving conversion efficiency and the like, there has been known a technique using organic dye such as cyanine type dye (for example, refer to Japanese Unexamined Patent Publication No. 2000-294303). Also, when a dye molecule has an electron-withdrawing group, it is thought to be effective in improving the conversion efficiency.

SUMMARY OF THE INVENTION

However, sufficient conversion efficiency is not obtained in the photoelectric conversion device using a dye of the related art, and therefore the improvement is further desirable.

In view of the foregoing, it is desirable to provide a photoelectric conversion device capable of improving the conversion efficiency.

A first photoelectric conversion device of an embodiment of the present invention includes a dye, and an electrode having a carrier carrying the dye. The dye includes a compound having an anchor group and represented by Chemical Formula 1. The anchor group is an electron-withdrawing group which can be chemically bonded to the carrier.

Chemical Formula 1

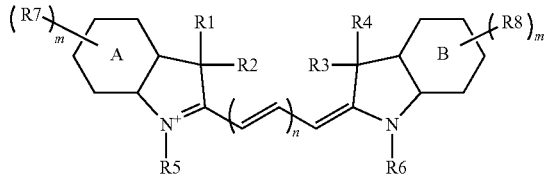

(where R1 and R2 are substituents, and R1 and R2 each may be identical or different and may form a ring structure by bonding with each other; R3 and R4 are substituents, and R3 and R4 each may be identical or different and may form a ring structure by bonding with each other; R5 and R6 are substituents, and R5 and R6 each may be identical or different; Ring A and Ring B are benzene rings or naphthalene rings; R7 and R8 are substituents, and R7 may be identical or different, provided that two or more of R7 are present; R7 may form a ring structure by bonding with each other, provided that two or more of R7 are present adjacent to each other; R8 may be identical or different, provided that two or more of R8 are present; R8 may form a ring structure by bonding with each other, provided that two or more of R8 are present adjacent to each other; at least one selected from the group consisting of R1, R2, R3, R4, R5, R6, R7, and R8 is a substituent having a ring or branch structure; an anchor group may be included in at least one selected from the group consisting of R1, R2, R3, R4, R5, R6, R7, and R8; m is an integer of 0 or more; and n is a integer of 0 or more).

In the first photoelectric conversion device of an embodiment of the present invention, the dye includes the compound having an anchor group and indicated in Chemical Formula 1 so that crystallization of the dye on the surface of the carrier is suppressed. Thus, the dye carried on the surface of the carrier efficiently absorbs light. The dye absorbing the light injects an electron into the carrier; thereby the photoelectric conversion is performed.

In the first the photoelectric conversion device of an embodiment of the present invention, the substituent having a ring or branch structure indicated in Chemical Formula 1 is preferably one of an alkyl group having a ring or branch structure and an alkyl group having an aromatic ring, and preferably a benzyl group, a derivative of a benzyl group, or a tertiary butyl group. Further, at least one selected from the group consisting of R1, R2, R3, and R4 indicated in Chemical Formula 1 is preferably the substituent having a ring or branch structure. Thus, crystallization of the dye on the surface of the carrier is further suppressed.

In the first photoelectric conversion device of an embodiment of the present invention, the anchor group may be a carboxyl group. At least one of R5 and R6 indicated in Chemical Formula 1 is preferably a group having an anchor group. Thus, the dye is carried on the surface of the carrier, and crystallization of the dye on the surface of the carrier is further suppressed.

Further, in the first photoelectric conversion device of an embodiment of the present invention, n indicated in Chemical Formula 1 is preferably 3 or less. The carrier preferably includes at least one of titanium oxide and zinc oxide. Thus, the dye carried on the surface of the carrier absorbs the light, and the dye absorbing the light more easily injects the electron into the carrier.

A second photoelectric conversion device of an embodiment of the present invention includes a dye, and an electrode having a carrier carrying the dye. The dye includes a compound having an anchor group and represented by Chemical Formula 2.

Chemical Formula 2

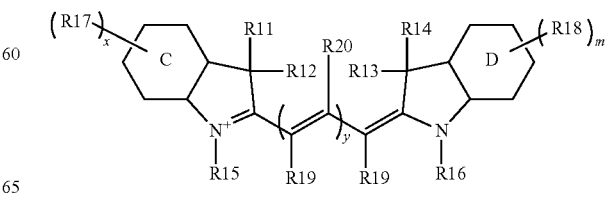

(where R11 and R12 are substituents, and R11 and R12 each may be identical or different and may form a ring structure by bonding with each other; R13 and R14 are substituents, and R13 and R14 each may be identical or different and may form a ring structure by bonding with each other; R15 and R16 are substituents, and R15 and R16 each may be identical or different; Ring C and Ring D are benzene rings or naphthalene rings; R17 and R18 are substituents, and R17 may be identical or different, provided that two or more of R17 are present; R17 may form a ring structure by bonding with each other, provided that two or more of R17 are present adjacent to each other; R18 may be identical or different, provided that two or more of R18 are present; R18 may form a ring structure by bonding with each other, provided that two or more of R18 are present adjacent to each other; at least one selected from the group consisting of R11, R12, R13, R14, R15, R16, R17, and R18 is a substituent having a ring or branch structure; R19 is a hydrogen group or a substituent, and R19 each may be identical or different, provided that two or more of R19 are present; R19 each may form a ring structure by bonding with each other, provided that two or more of R19 are present adjacent to each other; R20 is a hydrogen group or a substituent except a halogen group, and R20 each may be identical or different, provided that two or more of R20 are present; R20 each may form a ring structure by bonding with each other, provided that two or more of R20 are present adjacent to each other; at least one of R19 and R20 is a substituent; an anchor group may be included in at least one selected from the group consisting of R11, R12, R13, R14, R15, R16, R17, R18, R19, and R20; x is an integer of 0 or more; and y is a integer of 0 or more).

In the second photoelectric conversion device of an embodiment of the present invention, the dye includes the compound having an anchor group and indicated in Chemical Formula 2 so that crystallization of the dye on the surface of the carrier is suppressed. Thus, the dye carried on the surface of the carrier efficiently absorbs light. The dye absorbing the light injects an electron into the carrier; thereby the photoelectric conversion is performed.

In the second photoelectric conversion device of an embodiment of the present invention, the substituent having a ring or branch structure indicated in Chemical Formula 2 may be one of an alkyl group having a ring or branch structure and an alkyl group having an aromatic ring, and may be a benzyl group or a tertiary butyl group. Further, at least one selected from the group consisting of R11, R12, R13, and R14 indicated in Chemical Formula 2 may be the substituent having a ring or branch structure.

In the second photoelectric conversion device of an embodiment of the present invention, the anchor group may be a carboxyl group. At least one of R15 and R16 indicated in Chemical Formula 2 may be a group having an anchor group. Further, y indicated in Chemical Formula 2 may be 3 or less.

Further, in the second photoelectric conversion device of an embodiment of the present invention, the carrier preferably includes at least one of titanium oxide and zinc oxide. Thus, the dye carried on the surface of the carrier absorbs the light, and the dye absorbing the light more easily injects the electron into the carrier.

A third photoelectric conversion device of an embodiment of the present invention includes a dye, and an electrode having a carrier carrying the dye. The dye includes a compound having an anchor group and represented by Chemical Formula 3.

Chemical Formula 3

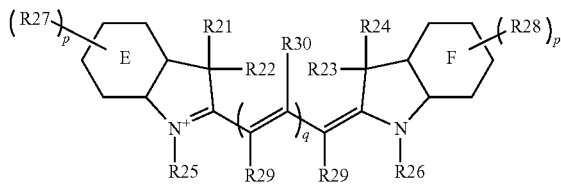

(where R21 and R22 are substituents, and R21 and R22 each may be identical or different, and may form a ring structure by bonding with each other; R23 and R24 are substituents, and R23 and R24 each may be identical or different and may form a ring structure by bonding with each other; R25 and R26 are substituents, and R25 and R26 each may be identical or different; Ring E and Ring F are benzene rings or naphthalene rings; R27 and R28 are substituents, and R27 may be identical or different, provided that two or more of R27 are present; R27 may form a ring structure by bonding with each other, provided that two or more of R27 are present adjacent to each other; R28 may be identical or different, provided that two or more of R28 are present; R28 may form a ring structure by bonding with each other, provided that two or more of R28 are present adjacent to each other; at least one selected from the group consisting of R21, R22, R23, R24, R25, R26, R27, and R28 is a substituent having a ring structure; R29 is a hydrogen group or a substituent, and R29 each may be identical or different; adjacent R29 may form a ring structure by bonding with each other; R30 is a hydrogen group or a halogen group, and R30 each may be identical or different, provided that two or more of R30 are present; at least one of R30 is a halogen group; an anchor group may be included in at least one selected from the group consisting of R21, R22, R23, R24, R25, R26, R27, R28, and R29; p is an integer of 0 or more; and q is a integer of 0 or more).

In the third photoelectric conversion device of an embodiment of the present invention, the dye includes the compound having an anchor group and indicated in Chemical Formula 3 so that crystallization of the dye on the surface of the carrier is suppressed. Thus, the dye carried on the surface of the carrier efficiently absorbs light. The dye absorbing the light injects an electron into the carrier; thereby the photoelectric conversion is performed.

In the third photoelectric conversion device of an embodiment of the present invention, the substituent having a ring structure indicated in Chemical Formula 3 may be one of an alkyl group having a ring structure and an alkyl group having an aromatic ring, and may be a benzyl group. Further, at least one selected from the group consisting of R21, R22, R23, and R24 indicated in Chemical Formula 3 may be the substituent having a ring structure.

In the third photoelectric conversion device of an embodiment of the present invention, the anchor group may be a carboxyl group. At least one of R25 and R26 indicated in Chemical Formula 3 may be a group having an anchor group. Further, q indicated in Chemical Formula 3 may be 3 or less.

Further, in the third photoelectric conversion device of an embodiment of the present invention, the carrier preferably includes at least one of titanium oxide and zinc oxide. Thus, the dye carried on the surface of the carrier absorbs the light, and the dye absorbing the light more easily injects the electron into the carrier.

The first photoelectric conversion device of an embodiment of the present invention includes a dye, and an electrode having a carrier carrying the dye. The dye includes a compound having an anchor group and indicated in Chemical Formula 1. Thus, the conversion efficiency can be improved.

In the case that the dye includes a compound where the substituent having a ring or branch structure indicated in Chemical Formula 1 is an alkyl group having a ring or branch structure, or a alkyl group having an aromatic ring; a compound where the substituent is a benzyl group, a derivative of a benzyl group, or a tertiary butyl group; or a compound where at least one selected from the group consisting R1, R2, R3, and R4 indicated in Chemical Formula 1 has a ring or branch structure, the higher conversion efficiency can be obtained.

Also, in the case that the dye includes a compound where at least one of R5 and R6 indicated in Chemical Formula 1 has an anchor group; or a compound where n indicated in Chemical Formula 1 is 3 or less, the higher conversion efficiency can be obtained.

Further, in the case that the carrier includes at least one of titanium oxide and zinc oxide, the higher conversion efficiency can be obtained.

The second photoelectric conversion device of an embodiment of the present invention includes a dye, and an electrode having a carrier carrying the dye. The dye includes a compound having an anchor group and indicated in Chemical Formula 2. Thus, the conversion efficiency can be improved.

In the case that the dye includes a compound where the substituent having a ring or branch structure indicated in Chemical Formula 2 is an alkyl group having a ring or branch structure, or a alkyl group having an aromatic ring; a compound where the substituent is a benzyl group or a tertiary butyl group; or a compound where at least one selected from the group consisting R11, R12, R13, and R14 indicated in Chemical Formula 2 has a ring or branch structure, the higher conversion efficiency can be obtained. Also, when the dye includes the compound indicated in Chemical Formula 2 where y is 3 or less, the higher conversion efficiency can be further obtained.

Further, when the carrier includes at least one of titanium oxide and zinc oxide, the higher conversion efficiency can be obtained.

The third photoelectric conversion device of an embodiment of the present invention includes a dye, and an electrode having a carrier carrying the dye. The dye includes a compound having an anchor group and indicated in Chemical Formula 3. Thus, the conversion efficiency can be improved.

In the case that the dye includes a compound where the substituent having a ring structure indicated in Chemical Formula 3 is an alkyl group having a ring structure, or a alkyl group having an aromatic ring; a compound where the substituent is a benzyl group; or a compound where at least one selected from the group consisting R21, R22, R23, and R24 indicated in Chemical Formula 3 has a ring structure, the higher conversion efficiency can be obtained. Also, when the dye includes the compound indicated in Chemical Formula 3 where q is 3 or less, the higher conversion efficiency can be further obtained.

Further, when the carrier includes at least one of titanium oxide and zinc oxide, the higher conversion efficiency can be obtained.

Other and further objects, features and advantages of the invention will appear more fully from the following description.

DETAILED DESCRIPTION OF THE PREFERRED EMBODIMENTS

Preferred embodiments of the present invention will be described in detail with reference to the accompanying drawings.

First Embodiment

Figure 1:
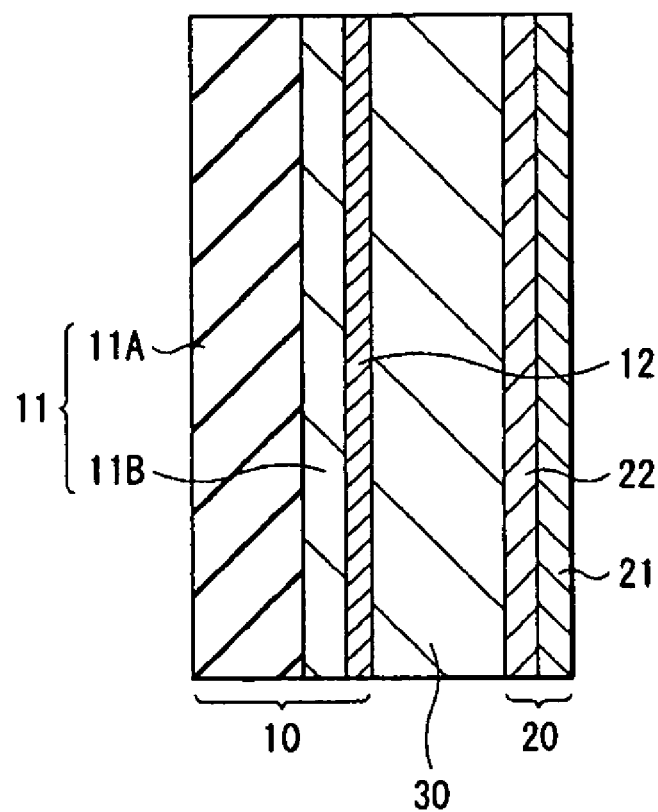
FIG. 1 is a cross-sectional view showing the configuration of a photoelectric conversion device according to an embodiment of the present invention.
Figure 2:
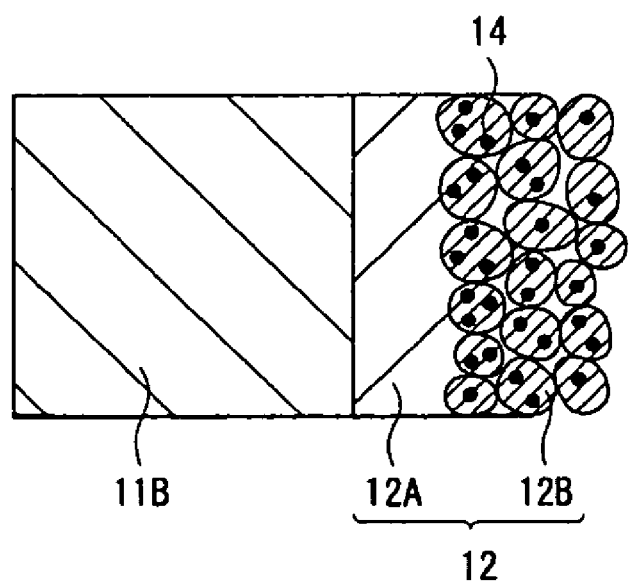
FIG. 2 is an enlarged cross-sectional view selectively showing main parts of the photoelectric conversion device of FIG. 1.

FIG. 1 schematically shows the cross-sectional configuration of a photoelectric conversion device according to an embodiment of the present invention. FIG. 2 selectively shows main parts of the photoelectric conversion device of FIG. 1 in enlarged scale. The photoelectric conversion device illustrated in FIGS. 1 and 2 corresponds to the main parts of a so-called dye-sensitized solar cell. The photoelectric conversion device includes a working electrode 10 and a facing electrode 20 facing each other with an electrolyte inclusion 30 in between. At least one of the working electrode 10 and the facing electrode 20 is an electrode having optical transparency.

The working electrode 10 has, for example, a configuration where a metal-oxide semiconductor layer 12 is provided on a conductive substrate 11, and a dye 14 is carried on the metal-oxide semiconductor layer 12 acting as a carrier. The working electrode 10 functions as a negative electrode to an external circuit. The conductive substrate 11 is, for example, provided with a conductive layer 11B on the surface of an insulating substrate 11A.

As materials of the substrate 11A, for example, there are given insulating materials such as glass, plastic, and a transparent polymer film. As the transparent polymer film, for example, there are given tetraacetyl cellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyestersulfone (PES), polyetherimide (PEI), cyclinc polyolefin, brominated phenoxy, and the like.

As materials of the conductive layer 11B, for example, there are given indium oxide, tin oxide, a conductive metal-oxide thin film such as indium-tin composite oxide (ITO) and fluorine-doped tin oxide (FTO: $F-SnO_2$), metal thin film such as gold (Au), silver (Ag), and platinum (Pt), materials formed of conductive high polymer, and the like.

The conductive substrate 11 may, for example, be configured to have a single-layered structure by materials having conductive properties. In this case, as materials of the conductive substrate 11, for example, there are given indium oxide, tin oxide, conductive metal-oxide such as indium-tin composite oxide and fluorine-doped tin oxide, metal such as gold, silver, and platinum, and conductive high polymer.

The metal-oxide semiconductor layer 12 is, for example, formed by a dense layer 12A and a porous layer 12B. On the interface of the conductive substrate 11 and the metal-oxide semiconductor layer 12, the dense layer 12A is formed. The dense layer 12A is preferably dense, and has few air gaps and a film shape. On the surface of the metal-oxide semiconductor layer 12 contacting the electrolyte inclusion 30, the porous layer 12B is formed. The porous layer 12B preferably has a lot of air gaps and has a large surface area. Especially, the porous layer 12B preferably has a configuration with porous molecules attached thereon. The metal-oxide semiconductor layer 12 may, for example, be formed to have a film shape and single-layered structure.

As materials of the metal-oxide semiconductor, for example, there are given titanium oxide, zinc oxide, tin oxide, niobium oxide, indium oxide, zirconium oxide, tantalum oxide, vanadium oxide, yttrium oxide, aluminum oxide, magnesium oxide, and the like. Among them, the materials of the metal-oxide semiconductor preferably include at least one of titanium oxide and zinc oxide, and more preferably include zinc oxide. This is because the dye 14 includes the compound having an anchor group and indicated in Chemical Formula 1; thereby the high conversion efficiency can be obtained. The metal-oxide semiconductor may singly use one of the materials, may plurally use two or more of the materials by combining (such as mix, mix crystal, and solid solution), and may use a combination of, for example, zinc oxide and tin oxide, titanium oxide and niobium oxide, and the like.

The dye 14 carried on the metal-oxide semiconductor layer 12 includes a compound (hereinafter, simply referred to as a compound indicated in Chemical Formula 1) having an anchor group and indicated in Chemical Formula 1. This means that the dye 14 carried on the metal-oxide semiconductor layer 12 includes the compound having a substituent which has a ring or branch structure of large dimensions. Thereby, crystallization of the dye 14 on the surface of the carrier is suppressed, and the superior conversion efficiency can be obtained.

The anchor group is an electron-withdrawing substituent capable of being chemically bonded to the metal-oxide semiconductor layer 12, and may be included in at least one selected from the group consisting of R1, R2, R3, R4, R5, R6, R7, and R8 indicated in Chemical Formula 1. As the anchor group, for example, there are given carboxylic acid group (—COOH), phosphoric acid group (—PO$_3$H$_2$, —PO$_4$H$_2$), sulfone acid group (—SO$_3$H), boric acid group (—B(OH)$_2$), derivatives thereof, and the like. Among them, carboxylic acid group is preferable as capable of obtaining the higher conversion efficiency. The anchor group is, for example, preferably introduced as at least one of R5 and R6 indicated in Chemical Formula 1 through an alkylene group or the like. This is because the higher effect can be obtained.

As a substituent having a ring or branch structure indicated in Chemical Formula 1, for example, there are given following substituents. That is, as a substituent having a ring structure, for example, there are given a group having an aromatic ring, or a group having a cycloalkane structure. As a group having an aromatic ring, for example, there are given —C$_6$H$_5$ (phenyl group), —CH$_2$—C$_6$H$_5$(benzyl group), —CH$_2$—CH$_2$—C$_6$H$_5$(phenethyl group), a derivative of a benzyl group such as —CH$_2$—C$_6$H$_4$—CH$_3$ which is a group with a methyl group introduced to a benzene ring of a benzyl group, —CH$_2$—C$_{10}$H$_7$ which is a group having a naphthalene ring, and —CH$_2$—C$_6$H$_4$—C$_6$H$_5$ which is a group having a biphenyl skeleton. As a group having a cycloalkane structure, for example, there are given —C$_4$H$_7$(cyclobutanyl group), a group having cyclobutanyl structure, —C$_6$H$_{11}$(cyclohexyl group), and a group having a cyclohexyl structure. As a substituent having a branch structure, for example, there are given —CH(CH$_3$)$_2$, —CH$_2$—CH(CH$_3$)$_2$, —CH$_2$—CH$_2$—CH(CH$_3$)$_2$, —CH$_2$—CH(CH$_3$)(C$_2$H$_5$), —C(CH$_3$)$_3$, —CH$_2$—C(CH$_3$)$_3$, —C(CH$_3$)$_2$—CH$_2$—C(CH$_3$)$_3$, and —CH$_2$—CH═C(CH$_3$)$_2$. As the substituent having a ring or branch structure, one of an alkyl group having a ring or branch structure and an alkyl group having an aromatic ring is preferable, and a benzyl group, a derivative of a benzyl group, or a tertiary butyl group is more preferable, because the higher conversion efficiency can be obtained. The substituent having a ring or branch structure is preferably introduced as at least one selected from the group consisting of R1, R2, R3 and R4 indicated in Chemical Formula 1, because the higher conversion efficiency can be obtained. Needless to say, the substituent is not limited as described above, as long as the substituent has a ring or branch structure.

Also, n indicated in Chemical Formula 1 is preferably 3 or less. If n is 4 or more, the sufficient conversion efficiency is hardly obtained. Especially, n is preferably from 0 to 2. Thereby, the higher conversion efficiency can be obtained, and as sensitizing wavelength (color variation), the application to a wide wavelength range from purple to red is possible.

As the compound indicated in Chemical Formula 1, for example, there are given a series of compounds indicated in Chemical Formula 4 to Chemical Formula 11. These compounds may be singly used, or plurally used by mixing them. Especially, the compounds indicated in Chemical Formula 4 to Chemical Formula 8 are more preferable, as the higher properties can be obtained.

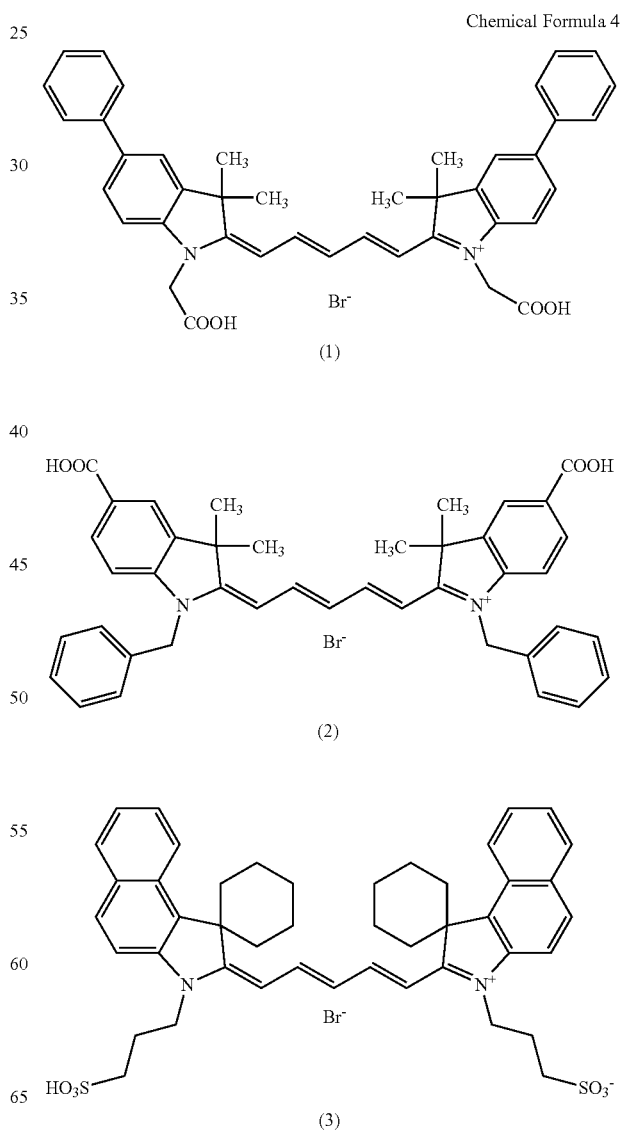

Chemical Formula 4

-continued
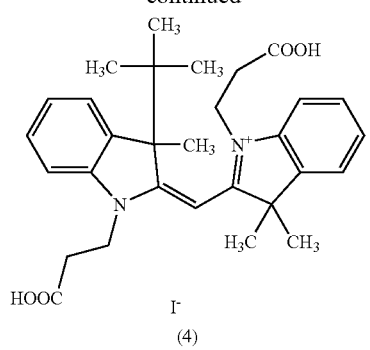
(4)
Chemical Formula 5
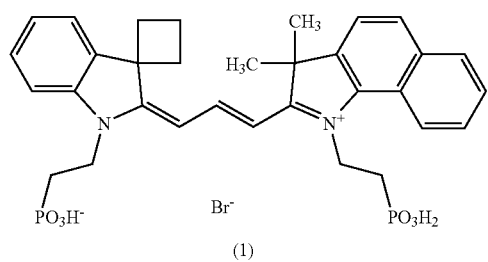
(1)
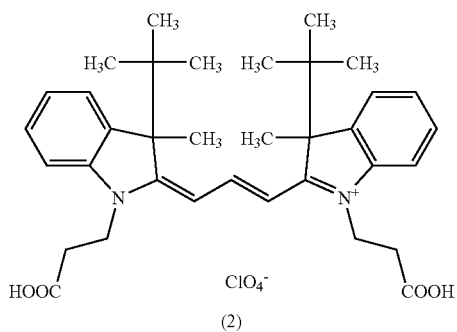
(2)
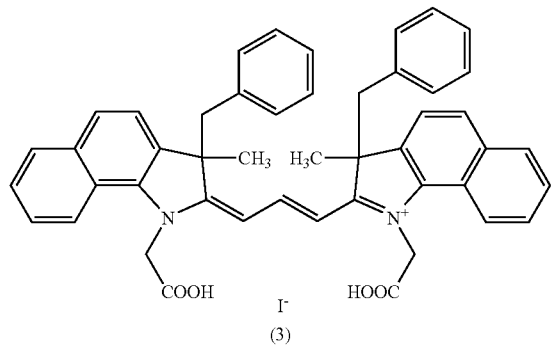
(3)
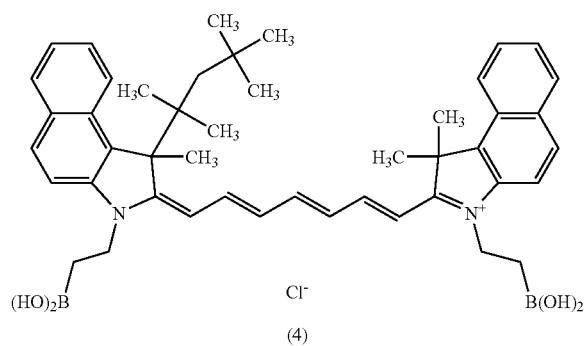
(4)
-continued
Chemical Formula 6
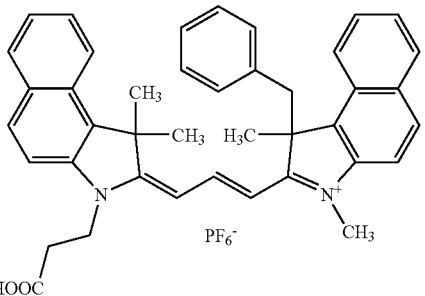
(1)
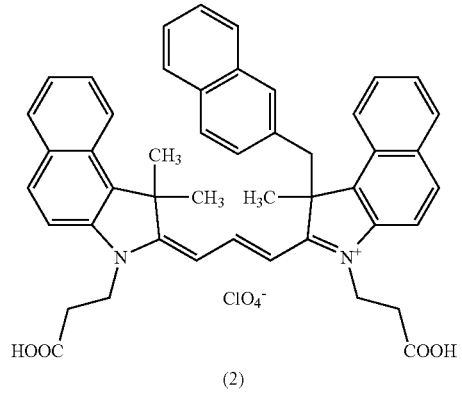
(2)
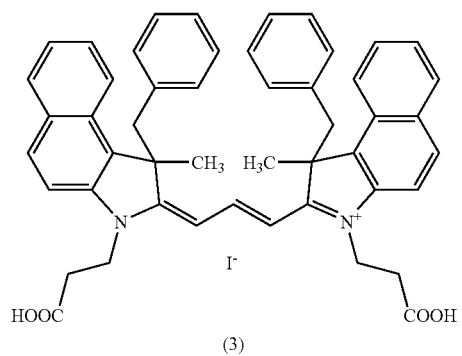
(3)
Chemical Formula 7
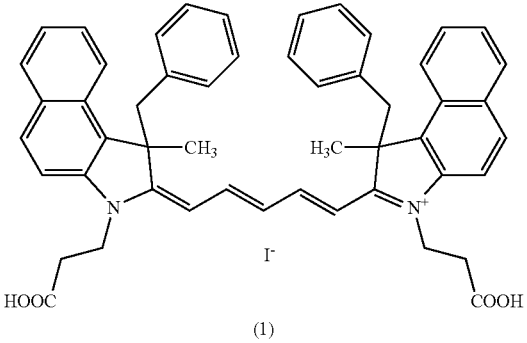
(1)

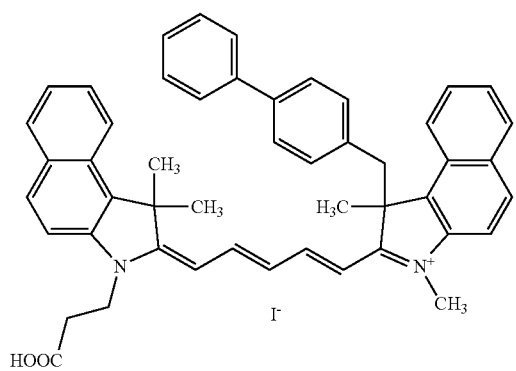
(2)
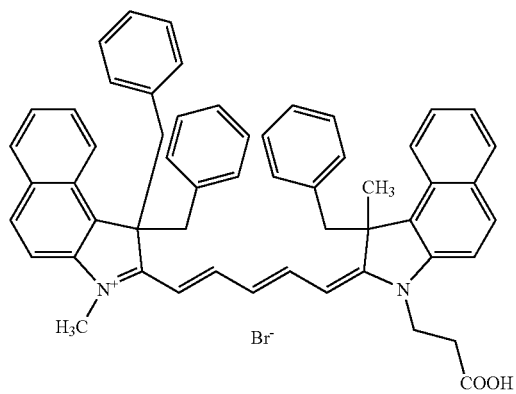
(3)
Chemical Formula 8
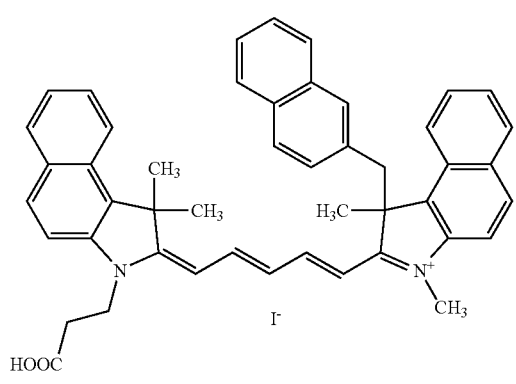
(1)
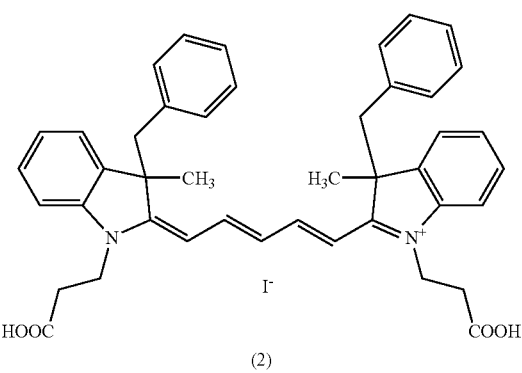
(2)
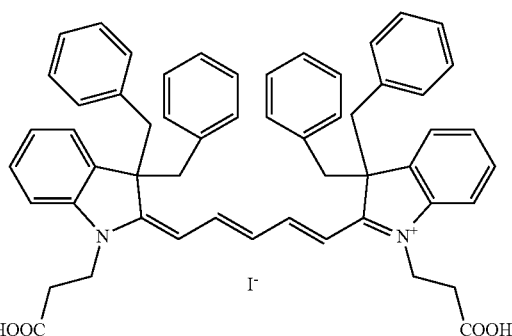
(3)
Chemical Formula 9
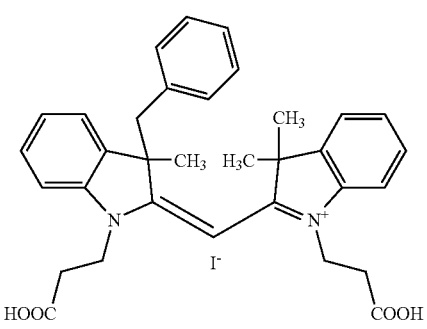
(1)
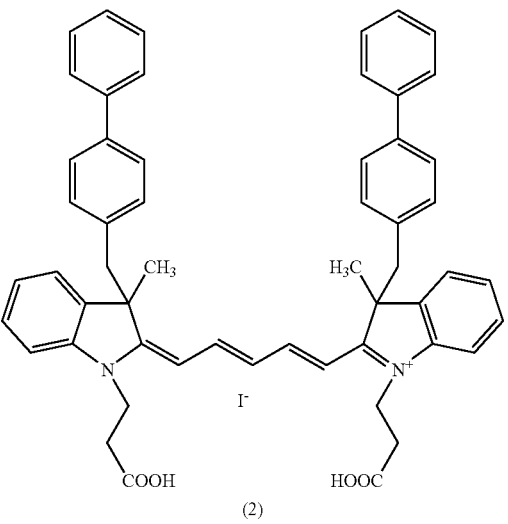
(2)

-continued

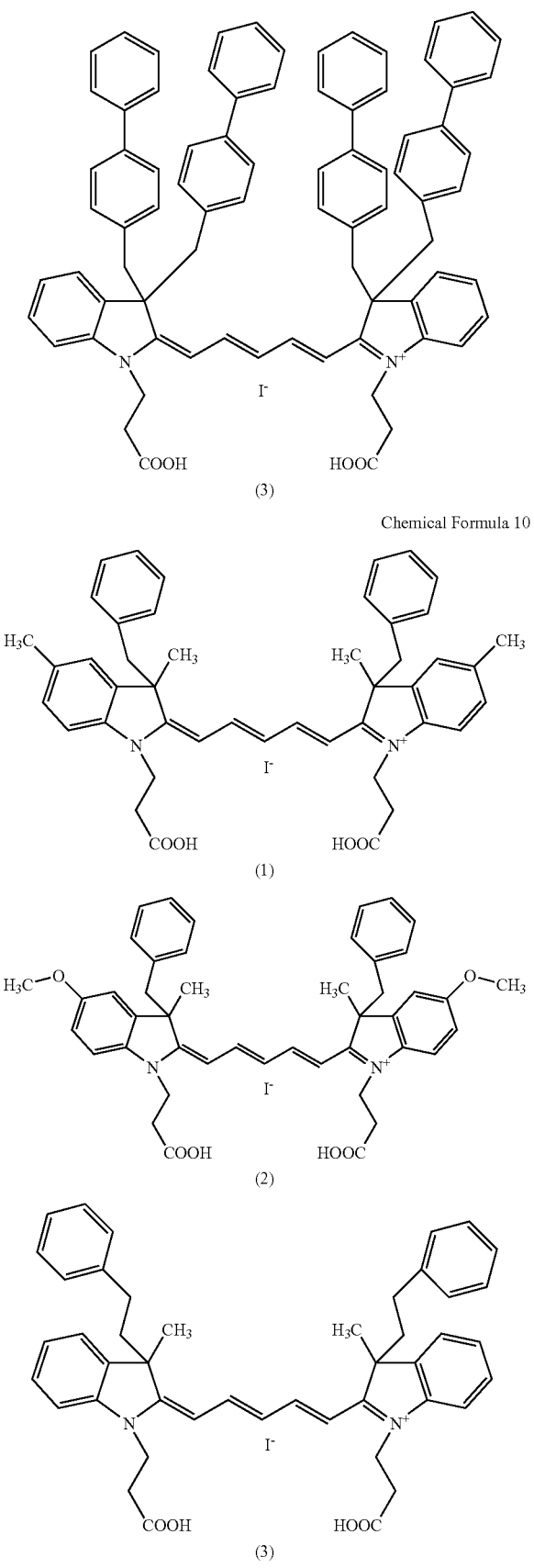

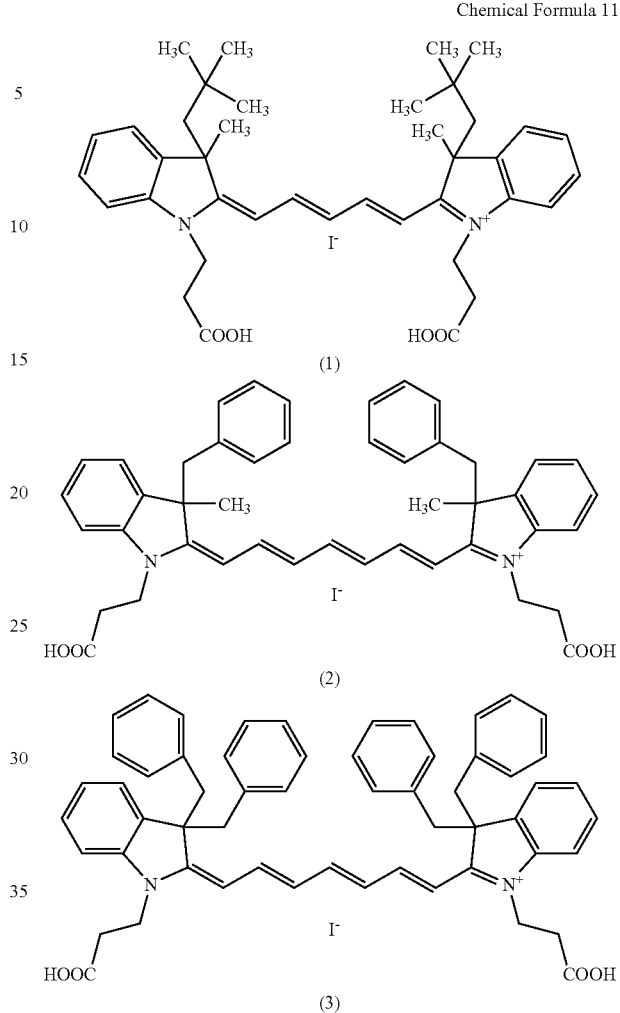

Needless to say, the compound indicated in Chemical Formula 1 is not limited to the compound indicated in Chemical Formula 4 to Chemical Formula 11, as long as the compound has an anchor group and the structure indicated in Chemical Formula 1.

The dye 14 may include dye other than described above. The other dye preferably has an electron-withdrawing substituent capable of being chemically bonded to the metal-oxide semiconductor layer 12. As the other dye, for example, there are given eosin Y, dibromofluorescein, fluorescein, rhodamine B, pyrogallol, dichlorofluorescein, erythrosin B, (erythrosine is a registered trademark), fluorecine, mercurochrome, cyanine type dye, merocyaninedisazo type dye, trisazo type dye, anthraquinone type dye, polycyclic quinone type dye, indigo type dye, diphenylmethane type dye, trimethylmethane type dye, quinoline type dye, benzophenone type dye, naphthoquinone type dye, perylene type dye, fluorenones type dye, squalelium type dye, azulenium type dye, perynone type dye, quinacridone type dye, organic dye such as metal-free phthalocyanine type dye and metal-free porphyrin type dye, and the like.

As the other dye, for example, there is also given an organic metal complex compound. As examples of the organic metal complex compound, there are given an organic metal complex compound having both of an ionic coordinate bond formed by a nitrogen anion and a metal cation present in an aromatic heterocycle, and nonionic coordinate bond formed between a nitrogen atom or a chalcogen atom, and a metal cation; and an organic metal complex compound having both of an ionic coordinate bond formed by an oxygen anion or a sulfur anion, and a metal cation, and nonionic coordinate bond formed between a nitrogen atom or a chalcogen atom, and a metal cation. Specifically, there are given metal phthalcyanine type dye such as copper phthalocyanine and tytanyl phthalocyanine, metal naphthalocyanine type dye, metal porphyrin type dye, and ruthenium complex such as bipyridyl ruthenium complex, terpyridyl ruthenium complex, phenanthroline ruthenium complex, bicinchonine acid ruthenium complex, azo ruthenium complex, quinolinol ruthenium complex, and the like.

The facing electrode 20 is, for example, provided with a conductive layer 22 on a conductive substrate 21. The facing electrode 20 functions as a positive electrode to an external circuit. As materials of the conductive substrate 21, for example, there are given materials similar to that of the conductive substrate 11 of the working electrode 10. As conductive materials used for the conductive layer 22, for example, there are given metal such as platinum, gold, silver, copper (Cu), rhodium (Rh), ruthenium (Ru), aluminum (Al), magnesium (Mg), and indium (In), carbon (C), conductive high polymer, and the like. These conductive materials may be singly used, or plurally used by mixing them. Also, as bond materials, for example, acrylic resin, polyester resin, phenol resin, epoxy resin, cellulose, melamine resin, fluoroelastomer, polyimide resin, and the like may be optionally used. The facing electrode 20 may, for example, have a single-layered structure of the conductive layer 22.

As the electrolyte inclusion 30, for example, there are given material including redox electrolytes, and the like. As the redox electrolytes, for example, there are given I-/$I_3$-type, Br-/$Br_3$-type, and quinone/hydroquinone type. As such redox electrolytes, for example, a combination of halogen of simple substance and at least one selected from the group consisting of cesium halide, quarternized alkylammonium halides, imidazolium halides, thiazolium halides, oxazolium halides, quinolinium halides, and pyridinium halides may be used. Specifically, cesium iodide, quarternized alkylammonium iodides such as tetraethylammonium iodide, tetrapropylammonium iodide, tetrabutylammonium iodide, tetrapentylammonium iodide, tetrahexylammonium iodide, tetraheptylammonium iodide and trimethylphenylammonium iodide, imidazolium iodides such as 3-methylimidazolium iodide and 1-propyl-2,3-dimethylimidazolium iodide, thiazolium iodides such as 3-ethyl-2-methyl-2-thiazolium iodide, 3-ethyl-5-(2-hydroxyethyl)-4-methylthiazolium iodide and 3-ethyl-2-methylbenzothiazolium iodide, and oxazolium iodides such as 3-ethyl-2-methyl-benzoxazolium iodide, and quinolinium iodides such as 1-ethyl-2-methylquinolinium iodide, and a combination of iodide and at least one selected from pyridinium iodides, a combination of bromine and quarternized alkylammonium bromide, and the like may be used. The electrolyte inclusion 30 may be a liquid electrolyte, or may be a solid high-polymer electrolyte where the liquid electrolyte is included in the high-polymer material. As a solvent of the liquid electrolyte, an electrochemically inert solvent may be used. For example, there are given acetonitrile, propylene carbonate, ethylene carbonate, and the like.

As the electrolyte inclusion 30, for example, a solid charge-transfer layer such as a solid electrolyte may be provided instead of the redox electrolyte. The solid charge-transfer layer has, for example, materials in which a carrier-transfer in the solid is related to electric conduction. As the materials, electron transport materials and hole transport materials are preferable.

As the hole transport materials, aromatic amines, triphenylene derivatives, and the like are preferable. For example, there are given organic conductive high polymers such as a oligothiophene compound, polypyrrole, polyacetylene or its derivatives, poly (p-phenylene) or its derivatives, poly (p-phenylenevinylene) or its derivatives, polythienylenevinylene or its derivatives, polythiophene or its derivatives, polyaniline or its derivatives, polytoluidine or its derivatives, and the like.

Also, as the hole transport materials, for example, a p-type inorganic compound semiconductor may be used. The p-type inorganic compound semiconductor preferably has a band gap of 2 eV or more, and more preferably has the band gap of 2.5 eV or more. In consideration of the condition where the hole of the dye can be reduced, ionization potential of the p-type inorganic compound semiconductor is necessarily smaller than the ionization potential of the working electrode 10. Although the preferable range of the ionization potential of the p-type inorganic compound semiconductor is varied according to the dye to be used, in general, it is preferably in the range from 4.5 eV to 5.5 eV, and more preferably in the range from 4.7 eV to 5.3 eV.

As the p-type inorganic compound semiconductor, for example, there is given a compound semiconductor including monovalent copper. As an example of the compound semiconductor including the monovalent copper, there are given CuI, CuSCN, $CuInSe_2$, $Cu(In, Ga)Se_2$, $CuGaSe_2$, $Cu_2O$, CuS, $CuGaS_2$, $CuInS_2$, $CuAlSe_2$, and the like. As the other p-type inorganic compound semiconductors, for example, there are given GaP, NiO, CoO, FeO, $Bi_2O_3$, $MoO_2$, $Cr_2O_3$, and the like.

As a method of forming such a solid charge-transfer layer, for example, there is given a method of forming the solid charge-transfer layer directly on the working electrode 10. Then the facing electrode 20 may be formed.

The hole transport materials including an organic conductive high polymer can, for example, be introduced to the inside of the electrode by vacuum deposition method, cast method, coating method, spin coat method, dipping method, electrolytic polymerization method, light electrolytic polymerization method, and the like. In the case of an inorganic solid compound, the hole transport materials including the inorganic solid compound may, for example, be introduced to the inside of the electrode by cast method, coating method, spin coat method, dipping method, electrolytic plating method, and the like.

A part of the solid charge-transfer layer (especially the one having the hole transport materials) formed in such a way is, preferably, penetrated partly in gaps of the porous structure of the metal-oxide semiconductor layer 12 so as to be directly in contact therewith.

The photoelectric conversion device can, for example, be manufactured in the following way.

First, for example, the metal-oxide semiconductor layer 12 is formed on a plane where the conductive layer 11B of the conductive substrate 11 is formed. The metal-oxide semiconductor layer 12 carries the dye 14 so that a working electrode 10 is manufactured. When forming the metal-oxide semiconductor layer 12, powder of the metal-oxide semiconductor is dispersed in sol of the metal-oxide semiconductor and thereby forming metal-oxide slurry. Then, the metal-oxide slurry is applied on the conductive substrate 11 to be dried, and is burned. Alternatively, the metal-oxide semiconductor layer 12 may, for example, be formed by electrolytic deposition. The conductive substrate 11 where the metal-oxide semiconductor layer 12 is formed is dipped in the dye solution where the dye 14 is dissolved in the organic solvent so that the dye 14 is carried on the metal-oxide semiconductor layer 12.

Next, for example, by forming the conductive layer 22 on one surface of the conductive substrate 21, the facing electrode 20 is manufactured. The conductive layer 22 is, for example, formed by sputtering conductive materials.

Next, the plane carrying the dye 14 of the working electrode 10, and the plane where the conductive layer 22 of the facing electrode 20 is formed are maintained with a predetermined space in between, and are arranged so as to face each other. Between the working electrode 10 and the facing electrode 20, the electrolyte inclusion 30 is injected so that the wholeness is sealed. Here, the photoelectric conversion device shown in FIGS. 1 and 2 is completed.

In the photoelectric conversion device, when the dye 14 carried by the working electrode 10 is illuminated (by sunlight or visible light with the same level as the sunlight), the dye erected by absorbing the light injects the electron into the metal-oxide semiconductor layer 12. Thus, a potential difference appears between the working electrode 10 and the facing electrode 20 and current flows between the working electrode 10 and the facing electrode 20; thereby photoelectric conversion is performed.

The photoelectric conversion device in the first embodiment includes the dye 14, and the working electrode 10 having the metal-oxide semiconductor layer 12 which carries the dye 14. The dye 14 includes a compound having an anchor group and indicated in Chemical Formula 1. Thus, crystallization of the dye 14 on the surface of the metal-oxide semiconductor layer 12 is suppressed; thereby the conversion efficiency can be improved in comparison with the case where the dye 14 includes a compound indicated in Chemical Formula 12.

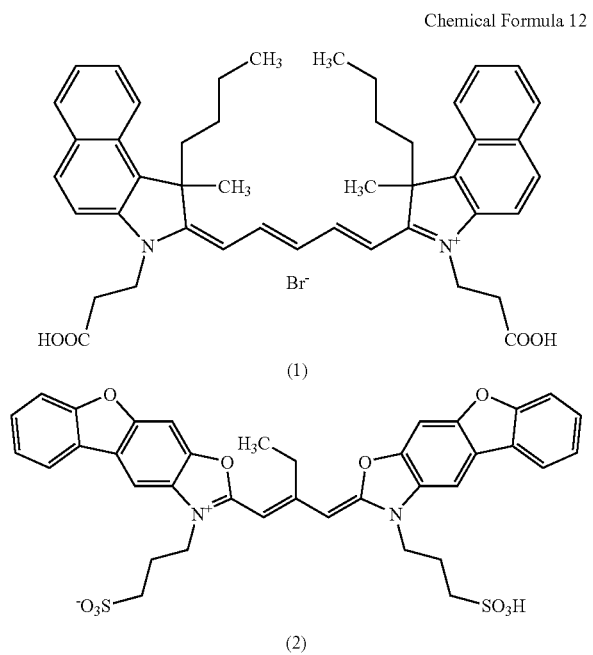

Chemical Formula 12

In the case that the dye 14 includes a compound where the substituent having a ring or branch structure indicated in Chemical Formula 1 is an alkyl group having a ring or branch structure, or a alkyl group having an aromatic ring; a compound where the substituent is a benzyl group, a derivative of a benzyl group, or a tertiary butyl group; or a compound where at least one selected from the group consisting R1, R2, R3, and R4 indicated in Chemical Formula 1 has a ring or branch structure, the higher conversion efficiency can be obtained.

Also, in the case that the dye 14 includes a compound where at least one of R5 and R6 indicated in Chemical Formula 1 has an anchor group, or a compound where n indicated in Chemical Formula 1 is 3 or less, the higher conversion efficiency can be obtained.

Further, in the case that the dye 14 includes at least one of titanium oxide and zinc oxide as materials of the metal-oxide semiconductor, the higher conversion efficiency can be obtained.

Second Embodiment

Next, a second embodiment of the present invention will be described. Same reference numerals as in the above first embodiment have been used to indicate substantially identical components, thereby the description appropriately omitted. The second embodiment has a similar configuration and uses a similar manufacturing process as in the first embodiment except that a dye 14 has an anchor group, and a compound indicated in Chemical Formula 2 (hereinafter, simply referred to as compounds indicated in Chemical Formula 2), and has an anchor group and includes at least one of compounds indicated in Chemical Formula 3 (hereinafter, simply referred to as compounds indicated in Chemical Formula 3).

The dye 14 includes a compound indicated in Chemical Formula 2 or a compound indicated in Chemical Formula 3. This means that the dye 14 includes the compound having a substituent which has a ring or branch structure of large dimensions. Thereby, crystallization of the dye 14 on the surface of the carrier is suppressed, and the superior conversion efficiency can be obtained.

The anchor group of the compound indicated in Chemical Formula 2 is similar to the anchor group of the compound indicated in Chemical Formula 1. This canchor group may be included in at least one selected from the group consisting of R11, R12, R13, R14, R15, R16, R17, R18, R19 and R20 indicated in Chemical Formula 2. As the anchor group, a carboxyl group is preferable, because the higher conversion efficiency can be obtained. Also, the anchor group may, for example, be introduced as at least one of R15 and R16 indicated in Chemical Formula 2 through an alkylene group or the like. Alternatively, the anchor group may, for example, be introduced as at least one of R19 and R20 through a sulfur or benzene group, or the like.

As a substituent having a ring or branch structure indicated in Chemical Formula 2, for example, there are given a substituent similar to the substituent having a ring or branch structure indicated in Chemical Formula 1. As the substituent having a ring or branch structure, either one of an alkyl group having a ring or branch structure and an alkyl group having an aromatic ring is preferable, and a benzyl group, a derivative of a benzyl group, or tertiary butyl group is more preferable, because the higher conversion efficiency can be obtained. The substituent having a ring or branch structure is preferably introduced as at least one selected from the group consisting of R11, R12, R13, and R14 indicated ni Chemical Formula 2, because the higher conversion efficiency can be obtained.

R19 indicated in Chemical Formula 2 is a hydrogen group (—H) or a substituent, and R20 is a hydrogen group or a substituent except a halogen group. Also, at least one of R19 and R20 is a substituent. That is, the compound indicated in Chemical Formula 2 is a derivative of the compound indicated in Chemical Formula 1. Specifically, Chemical Formula 1 has a structure where a part of or an entire part of hydrogen having a methine chain linking two indolenine skeletons is substituted. The kind of substituent bonded to R19 may be arbitrarily selected. However, it is preferred that two adjacent R19 are bonded to each other so that the compound indicated in Chemical Formula 2 has a ring structure including a methine chain as a part of the ring. As the ring structure including the methine chain as a part of the ring, for example, there is given a cyclopentene structure (1) or a cyclohexene structure (2) indicated in Chemical Formula 13. In the case of the ring structure including a methine chain as a part of the ring, a substituent may be further bonded to the ring structure. R19 may be a halogen group. As the halogen group, for example, there are given a fluorine group, a chlorine group, a bromine group, and an iodine group. The kind of the sustituend bonded to R20 may be arbitrarily selected. However, similarly to R19, the compound indicated in Chemical Formula 2 preferably may have a ring structure including a methin chain as a part of the ring, and two adjacent R20 are bonded to each other. In the case of the ring structure including a methine chain as a part of the ring, a substituent may be further bonded to the ring structure.

Chemical Formula 13

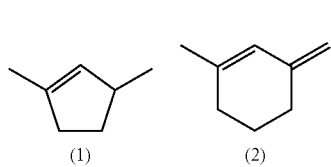

(1)   (2)

y indicated in Chemical formula 2 is preferably 3 or less. This is because, if y is 4 or more, the sufficient conversion efficiency is hardly obtained. Especially, y is preferably from 0 to 2. Thereby, the higher conversion efficiency can be obtained, and as sensitizing wavelength (color variation), the application to wide wavelength range from purple to red is possible.

As the compound indicated in Chemical Formula 2, for example, there are given a series of compounds to be represented by Chemical Formula 14. These compounds may be singly used, or plurally used by mixing them. Especially, the compound indicated in Chemical Formula 14 (1) is more preferable, as the higher properties can be obtained.

Chemical Formula 14

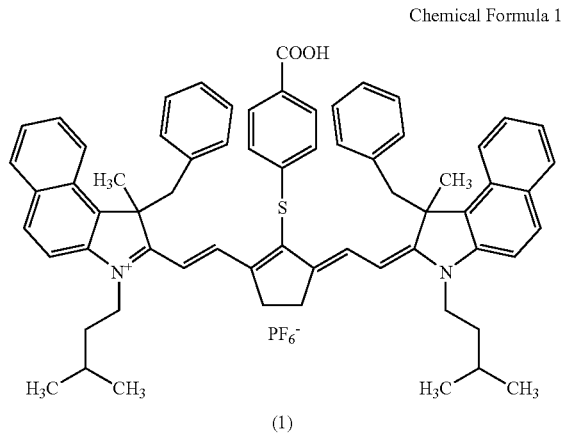

(1)

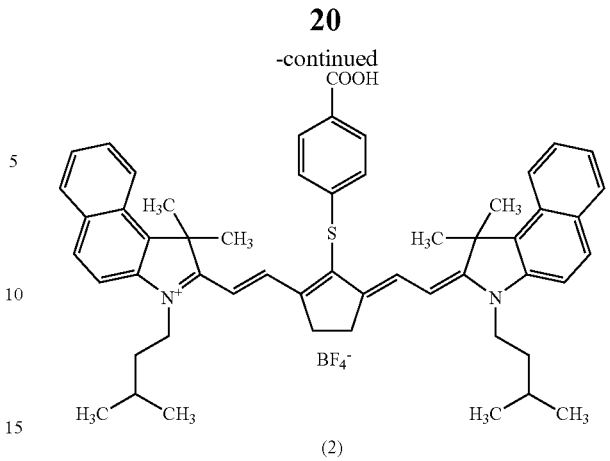

(2)

Needless to say, the compound indicated in Chemical Formula 2 is not limited to the compound indicated in Chemical Formula 14, as long as the compound has an anchor group and the structure indicated in Chemical Formula 2.

The anchor group of the compound indicated in Chemical Formula 3 is similar to the anchor group of the compound indicated in Chemical Formula 1. This anchor group may be included in at least one selected from the group consisting of R21, R22, R23, R24, R25, R26, R27, R28, and R29 indicated in Chemical Formula 3. As the anchor group, a carboxyl group is preferable, because the higher conversion efficiency can be obtained. Also, the anchor group may, for example, be introduced as at least one of R25 and R26 indicated in Chemical Formula 3 through an alkylene group or the like.

The compound indicated in Chemical Formula 3 has a substituent having a ring structure. This is because, the compound has a substituent having a ring structure of large dimensions so that crystallization of the dye on the surface of the carrier is suppressed and the superior conversion efficiency can be obtained. In this case, the higher effect can be obtained in comparison with the case where the compound has a substituent having a branch structure instead of the ring structure. As a substituent having a ring structure indicated in Chemical Formula 3, for example, there is given a substituent similar to the substituent having a ring structure indicated in Chemical Formula 1. As the substituent having the ring structure, either one of an alkyl group having a ring structure or an alkyl group having an aromatic ring is preferable, and a benzyl group or a derivative of a benzyl group is more preferable, because the higher conversion efficiency can be obtained. The substituent having the ring structure is preferably introduced as at least one of the group consisting of R21, R22, R23, and R24 indicated in Chemical Formula 3, because the higher conversion efficiency can be obtained.

R29 indicated in Chemical Formula 3 is a hydrogen group or a substituent, and R30 is a hydrogen group or a halogen group. Also, at least one of R30 is, for example, a halogen group such as a fluorine group, a chlorine group, a bromine group, and an iodine group. That is, similarly to the compound indicated in Chemical formula 2, the compound indicated in Chemical Formula 3 is a derivative of the compound indicated in Chemical Formula 1. The kind of substituent bonded to R29 may be arbitrarily selected. However, R29 preferably has a halogen group, or a methine chain as a part of the ring where two adjacent R29 are bonded to each other. As the ring structure including the methine chain as a part of the ring, for example, there is given a structure indicated in Chemical Formula 13 as described above. R29 may have a ring structure including a methine chain as a part of the ring, or a substituent may be further bonded to the ring structure.

q indicated in Chemical formula 3 is preferably 1, 2, or 3. This is because if q is 4 or more, the sufficient conversion efficiency is hardly obtained. Especially, q is preferably 1 or 2. Thereby, the higher conversion efficiency can be obtained, and as sensitizing wavelength (color variation), the application to wide wavelength range from purple to red is possible.

As the compound indicated in Chemical Formula 3, for example, there is given a compound represented by Chemical Formula 15.

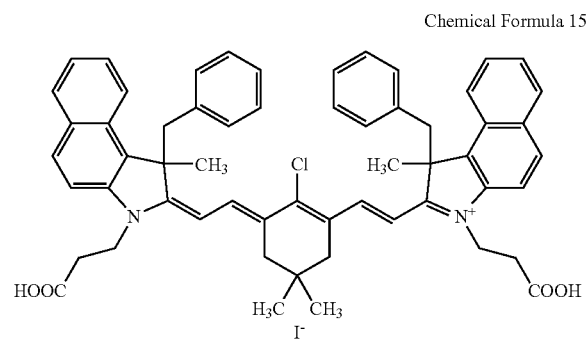

Chemical Formula 15

Needless to say, the compound indicated in Chemical Formula 3 is not limited to the compound indicated in Chemical Formula 15, as long as the compound has an anchor group and the structure indicated in Chemical Formula 3.

The dye 14 may include the compound indicated in Chemical Formula 1 and the other dye, in addition to at least one of the compound indicated in Chemical Formula 2 and the compound indicated in Chemical Formula 3. Here, the other dye is similar to the other dye described in the first embodiment.

In the photoelectric conversion device, when the dye 14 carried by the working electrode 10 is illuminated (by sunlight or visible light with the same level as the sunlight), the dye 14 erected by absorbing the light injects the electron into the metal-oxide semiconductor layer 12. Thus, potential difference appears between the working electrode 10 and the facing electrode 20 and current flows between the working electrode 10 and the facing electrode 20; thereby photoelectric conversion is performed.

The photoelectric conversion device in the second embodiment includes the dye 14, and the working electrode 10 having the metal-oxide semiconductor layer 12 which carries the dye 14. The dye 14 includes at least one of a compound having an anchor group and indicated in Chemical Formula 2, and a compound having an anchor group and indicated in Chemical Formula 3. Thus, crystallization of the dye 14 on the surface of the metal-oxide semiconductor layer 12 is suppressed; thereby the conversion efficiency can be improved in comparison with the case where the dye 14 includes a compound indicated in Chemical Formula 12 and the case where the dye 14 includes a compound indicated in Chemical Formula 16.

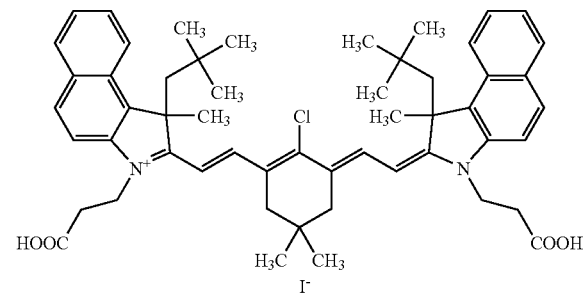

Chemical Formula 16

In the case that the dye 14 includes a compound where the substituent having a ring or branch structure indicated in Chemical Formula 2 is an alkyl group having a ring or branch structure, or a alkyl group having an aromatic ring; a compound where the substituent is a benzyl group, or a tertiary butyl group; or a compound where at least one selected from the group consisting R11, R12, R13, and R14 indicated in Chemical Formula 2 has a ring or branch structure, the high conversion efficiency can be obtained.

Also, in the case that the dye 14 includes a compound where at least one of R15 and R16 indicated in Chemical Formula 2 has an anchor group, or a compound where y indicated in Chemical Formula 2 is 3 or less, the high conversion efficiency can be obtained.

In the case that the dye 14 includes a compound where the substituent having a ring structure indicated in Chemical Formula 3 is an alkyl group having a ring structure, or a alkyl group having an aromatic ring; a compound where the substituent is a benzyl group; or a compound where at least one selected from the group consisting R21, R22, R23, and R24 indicated in Chemical Formula 3 has a ring structure, the high conversion efficiency can be obtained.

Also, in the case that the dye 14 includes a compound where at least one of R25 and R26 indicated in Chemical Formula 3 has an anchor group, or a compound where q indicated in Chemical Formula 2 is 3 or less, the high conversion efficiency can be obtained.

Further, in the case that the dye 14 includes at least one of titanium oxide and zinc oxide as materials of the metal-oxide semiconductor, the higher conversion efficiency can be obtained.

EXAMPLE

Specific examples of the present invention will be described in detail.

Example 1-1

As a specific example of the photoelectric conversion device described in the embodiment, a dye-sensitized solar cell using titanium oxide as materials of a metal-oxide semiconductor, and a dye-sensitized solar cell using zinc oxide were manufactured by the following steps.

First, a working electrode 10 of the dye-sensitized solar cell using titanium oxide was manufactured. While stirring, 125 cm$^3$ of titanium isopropoxide was added to 750 cm$^3$ of 0.1 mol/dm$^3$ nitric acid solution and stirred hard for 8 hours at 80° C. The resulting liquid was subjected to autoclave treatment for 16 hours at 230° C. in a pressure vessel of Teflon (Teflon is a registered trademark). Then, sol including sediment was resuspended by stirring. Next, by suction filtration, the sediment which had not been resuspended was removed, and the sol was concentrated with an evaporator until the concentration of titanium oxide became 11 mass %. To enhance the coating properties to the substrate, a drop of Triton X-100 (Triton is a registered trademark) was added. Next, powder of titanium oxide P-25 was added to the titanium oxide sol so that the content rate of titanium oxide became 33 mass % as a whole. Then, centrifugal stirring was performed for 1 hour for dispersion by using rotation and revolution so that the titanium oxide sol was adjusted. Thereby, metal-oxide slurry was prepared.

Next, on a conductive substrate 11 of a conductive glass substrate (F—$SnO_2$) having a height of 2.0 cm, a width of 1.5 cm, and a thickness of 1.1 mm, masking tape having a thickness of 70 μm was taped so as to enclose a square of a height of 0.5 cm and a width of 0.5 cm. After applying 3 cm$^3$ of the metal-oxide slurry of a uniform thickness on the square part to be dried, the masking tape was removed. Next, the substrate was burned at 500° C. in an electric furnace so as to form a metal-oxide semiconductor layer 12 having a thickness of approximately 10 μm. The conductive substrate 11 where the titanium oxide semiconductor layer was formed as the metal-oxide semiconductor layer 12 was dipped in anhydrous ethanol solution (3×10$^{-4}$ mol/dm$^3$) of the compound indicated in Chemical Formula 4 (1), and the dye 14 was carried on the metal-oxide semiconductor layer 12.

Next, on one surface of a conductive substrate 21 of the conductive glass substrate (F—$SnO_2$) having the height of 2.0 cm, the width of 1.5 cm, and the thickness of 1.1 mm, a conductive layer 22 of platinum having the thickness of 100 nm was formed by sputtering so that a facing electrode 20 was manufactured. Previously, two holes (φ1 mm) for injecting an electrolyte inclusion 30 was made on the conductive substrate 21. The electrolyte inclusion 30 was prepared to have a concentration of dimethyl-hexyl-imidazolium iodide (0.6 mol/dm$^3$), lithium iodide (0.1 mol/dm$^3$), iodine (0.05 mol/dm$^3$), and water (1 mol/dm$^3$) with respect to acetonitrile.

Next, so as to maintain a predetermined space between a plane carrying the dye 14 of the working electrode 10, and the plane where the conductive layer 22 of the facing electrode 20 was formed, a spacer with the thickness of 50 μm was stuck in between. At this time, the spacer was disposed so as to enclose the surrounding of the metal-oxide semiconductor layer 12. Next, the adjusted electrolyte inclusion 30 was injected from the holes made on the facing electrode 20, and the dye-sensitized solar cell was obtained.

A dye-sensitized solar cell was manufactured by the similar steps as described above except that zinc oxide was used for materials of the metal-oxide semiconductor as the working electrode 10. Here, the working electrode 10 was manufactured in the following steps. First, on the conductive substrate 11 of a conductive glass substrate (F—$SnO_2$) having the height of 2.0 cm, the width of 1.5 cm, and the thickness of 1.1 mm, a metal-oxide semiconductor layer 12 of zinc oxide was manufactured by electrolytic deposition. For the electrolytic deposition, used were 40 ml of electrolytic solution prepared to have a concentration of eosin Y (30 μmol/dm$^3$), zinc chloride (5 mmol/dm$^3$), and potassium chloride (0.09 mol/dm$^3$) with respect to water, a counter electrode of zinc plate, and a reference electrode of silver/silver chloride electrode. First, the electrolytic bath was subjected to bubbling by oxygen for 15 minutes, and a film was deposited on the surface of the conductive substrate 11 while constant-potential electrolysis with electric potential of −1.0 V was subjected to bubbling for 60 minutes at 70° C. This substrate was dipped in potassium hydroxide solution (pH11) without being dried, and then eosin Y was desorbed by washing with water. Next, a metal-oxide semiconductor layer 12 was formed by drying for 30 minutes at 150° C. Next, the metal-oxide semiconductor layer 12 was dipped in anhydrous ethanol solution (5 mmol/dm$^3$) of a compound indicated in Chemical Formula 4 (1) to carry the dye 14 so that the working electrode 10 was manufactured.

Examples 1-2 to 1-17

The similar steps to example 1-1 were taken except that compounds indicated in Chemical Formula 4 (2) (example 1-2), Chemical Formula 4 (3) (example 1-3), Chemical Formula 4 (4) (example 1-4), Chemical Formula 5 (1) (example 1-5), Chemical Formula 5 (2) (example 1-6), Chemical Formula 5 (3) (example 1-7), Chemical Formula 5 (4) (example 1-8), Chemical Formula 6 (1) (example 1-9), Chemical Formula 6 (2) (example 1-10), Chemical Formula 6 (3) (example 1-11), Chemical Formula 7 (1) (example 1-12), Chemical Formula 7 (2) (example 1-13), Chemical Formula 7 (3) (example 1-14), Chemical Formula 8 (1) (example 1-15), Chemical Formula 8 (2) (example 1-16) and Chemical Formula 8 (3) (example 1-17), were respectively used as the dye instead of the compound indicated in Chemical Formula 4 (1).

Comparative Examples 1-1 and 1-2

The similar steps to example 1-1 were taken except that the compound indicated in Chemical Formula 12 (1) (comparative example 1-1), or Chemical Formula 12 (2) (comparative example 1-2) was used as the dye instead of the compound indicated in Chemical Formula 4 (1).

The results indicated in Table 1 were obtained when the conversion efficiency of the dye-sensitized solar cells in examples 1-1 to 1-17, and comparative examples 1-1 to 1-2 was examined.

The conversion efficiency was obtained by the following calculation using a solar simulator of AM 1.5 (1000 W/m$^2$) as a light source. First, response current was measured by sweeping the voltage of the dye-sensitized solar cell with a source meter. Thus, the conversion efficiency (η:%) was obtained in the following way. The maximum output as a product of the voltage by the current was divided by light intensity per 1 cm$^2$. As the conversion efficiency, the resulting value was multiplied by 100 for the percent figure. That is, the conversion efficiency is indicated as: (maximum output/light intensity per 1 cm$^2$)×100.

TABLE 1

| | Dye | | Metal-oxide semiconductor |  |
|---|---|---|---|---|
| | | | Titanium oxide | Zinc oxide |
| | Kind | n | Conversion efficiency (%) | |
| Example 1-1 | Chemical Formula 4 (1) | 2 | 1.7 | 1.9 |
| Example 1-2 | Chemical Formula 4 (2) | 2 | 0.7 | 0.9 |
| Example 1-3 | Chemical Formula 4 (3) | 2 | 0.6 | 0.7 |
| Example 1-4 | Chemical Formula 4 (4) | 0 | 2.5 | 3.4 |
| Example 1-5 | Chemical Formula 5 (1) | 1 | 0.7 | 0.9 |
| Example 1-6 | Chemical Formula 5 (2) | 1 | 3.5 | 4.7 |
| Example 1-7 | Chemical Formula 5 (3) | 1 | 3.9 | 5.9 |
| Example 1-8 | Chemical Formula 5 (4) | 3 | 0.2 | 0.4 |
| Example 1-9 | Chemical Formula 6 (1) | 1 | 3.0 | 4.8 |
| Example 1-10 | Chemical Formula 6 (2) | 1 | 3.2 | 5.0 |
| Example 1-11 | Chemical Formula 6 (3) | 1 | 3.3 | 5.1 |

TABLE 1-continued

|  | Dye | | Metal-oxide semiconductor | |
|---|---|---|---|---|
|  | | | Titanium oxide | Zinc oxide |
|  | Kind | n | Conversion efficiency (%) | |
| Example 1-12 | Chemical Formula 7 (1) | 2 | 1.3 | 2.6 |
| Example 1-13 | Chemical Formula 7 (2) | 2 | 1.1 | 2.6 |
| Example 1-14 | Chemical Formula 7 (3) | 2 | 1.3 | 2.7 |
| Example 1-15 | Chemical Formula 8 (1) | 2 | 0.9 | 2.7 |
| Example 1-16 | Chemical Formula 8 (2) | 2 | 1.1 | 3.2 |
| Example 1-17 | Chemical Formula 8 (3) | 2 | 1.5 | 3.4 |
| Comparative example 1-1 | Chemical Formula 12 (1) | — | 0.1 | 0.2 |
| Comparative example 1-2 | Chemical Formula 12 (2) | — | 0.09 | 0.01 |

As shown in Table 1, the conversion efficiency was enhanced in examples 1-1 to 1-17 where the dye 14 includes the compound indicated in Chemical Formula 4 to Chemical Formula 8 in comparison with comparative examples 1-1 and 1-2 where the dye 14 included no such compound. That is, it was confirmed that the conversion efficiency was improved by the dye 14 including the compound indicated in Chemical Formula 4 to Chemical Formula 8 having a substituent which had a ring or branch structure, in comparison with the case (comparative examples 1-1 and 1-2) of the dye 14 including the compound indicated in Chemical Formula 12 which had a straight chain substituent.

Here, when paying attention to an anchor group, the conversion efficiency was enhanced in examples 1-1, 1-2, 1-4, 1-6, 1-7, and 1-9 to 1-17 having a carboxylic acid group as an anchor group, in comparison with examples 1-3, 1-5, and 1-8 having a phosphoric acid group, a sulfone group, and a boracic acid group. Also, by comparing example 1-1 with example 1-2, it was confirmed that the higher conversion efficiency was obtained when an anchor group was included in R5 or R6 indicated in Chemical Formula 1.

Also, when paying attention to the structure of the substituent having a ring or branch structure, by comparing examples 1-1 to 1-17, it was confirmed that the high conversion efficiency was obtained when the substituent having a ring or branch structure was an alkyl group having a ring or branch structure or an alkyl group having an aromatic ring. Especially, the higher conversion efficiency was obtained when the substituent was a tertiary butyl group, a benzyl group, or a derivative of a benzyl group. Further, the higher conversion efficiency was obtained, when the substituent was introduced in a position as at least one selected from the group consisting of R1, R2, R3, and R4 indicated in Chemical Formula 1. Further, from the comparison of the examples 1-9 to 1-11, and the examples 1-12 to 1-17, in the case of having a group having a naphthalene ring, or a group having a biphenyl structure, the conversion efficiency with the same level as the case of having benzyl group could be obtained. Also, as a number of benzyl groups was increased, the higher conversion efficiency could be obtained.

When paying attention to n in Chemical Formula 1, the conversion efficiency was from 2.5 to 3.4% in example 1-4 where n=0; from 0.7 to 5.9% in examples 1-5 to 1-7 and examples 1-9 to 1-11 where n=1; from 0.6 to 3.4% in examples 1-1 to 1-3 and examples 1-12 to 1-17 where n=2; and from 0.2 to 0.4% in example 1-8 where n=3. That is, it was confirmed that the sufficient conversion efficiency could be obtained in the range of n from 0 to 3, and especially the superior conversion efficiency could be obtained in the range from 0 to 2. Especially, it was confirmed that in the case where an anchor group was a carboxyl group, when n was 1, more superior conversion efficiency could be obtained.

Further, when paying attention to the materials of the metal-oxide semiconductor, in examples 1-1 to 1-17, the conversion efficiency was enhanced when using zinc oxide, in comparison with the case of using titanium oxide.

From these, the following were confirmed. The conversion efficiency was improved in the dye-sensitized solar cell including the compound having an anchor group and indicated in Chemical Formula 1. The high conversion efficiency was obtained when the substituent having a ring or branch structure indicated in Chemical formula 1 was an alkyl group having a ring or branch structure, or an alkyl group having an aromatic ring. Especially, the higher conversion efficiency was obtained when the substituent was a tertiary butyl group, a benzyl group, or a derivative of a benzyl group. Further, the higher conversion efficiency was obtained when at least one selected from the group consisting of R1, R2, R3, and R4 indicated in Chemical Formula 1 was a substituent having a ring or branch structure. Also, the high conversion efficiency was obtained when the anchor group was a carboxylic acid group. The high efficiency was obtained when at least one of R5 and R6 was a group having an anchor group. Also, n indicated in Chemical Formula 1 is preferably from 0 to 3, and especially the higher conversion efficiency was obtained when n was from 0 to 2. Further as the materials of the metal-oxide semiconductor, at least one of titanium oxide and zinc oxide was preferable, and especially the higher conversion efficiency was obtained by using zinc oxide.

Example 2-1 and 2-2

The similar steps to example 1-1 were taken except that the compound indicated in Chemical Formula 14 (1) which had an anchor group and was the compound indicated in Chemical Formula 2 (example 2-1), or the compound indicated in Chemical Formula 15 which had an anchor group and was the compound indicated in Chemical Formula 3 (example 2-2) was used as the dye instead of the compound indicated in Chemical Formula 4 (1).

Comparative Example 2

The similar steps to example 2-2 were taken except that the compound indicated in Chemical Formula 16 was used as the dye instead of the compound indicated in Chemica Formula 15.

The results indicated in Table 2 were obtained when the conversion efficiency of the dye-sensitized solar cells in examples 2-1 and 2-2, and comparative example 2 was examined in similar way to the case of example 1-1. In Table 2, the results of comparative examples 1-1 and 1-2 were also shown.

TABLE 2

|  | Dye | Metal-oxide semiconductor | |
|---|---|---|---|
|  | | Titanium oxide | Zinc oxide |
|  | | Conversion efficiency (%) | |
| Example 2-1 | Chemical Formula 14 (1) | 0.2 | 0.5 |
| Example 2-2 | Chemical Formula 15 | 0.4 | 0.9 |
| Comparative example 2 | Chemical Formula 16 | 0.04 | 0.1 |
| Comparative example 1-1 | Chemical Formula 12 (1) | 0.1 | 0.2 |

TABLE 2-continued

| | | Metal-oxide semiconductor | |
| | | Titanium oxide | Zinc oxide |
| | Dye | Conversion efficiency (%) | |
|---|---|---|---|
| Comparative example 1-2 | Chemical Formula 12 (2) | 0.09 | 0.01 |

As shown in Table 2, in the case that the compound indicated in Chemical Formula 2 was used as the dye, the results similar to Table 1 were obtained. That is, in example 2-1 where the dye 14 included the compound indicated in Chemical Formula 14 (1), the higher conversion efficiency was obtained in comparison with comparative examples 1-1 and 1-2 where the dye 14 included no such compound.

Although it was not indicated in the embodiments, when at least one selected from the group consisting of R11 to R14 indicated in Chemical Formula 2 was set as a tertiary butyl group, or a benzyl group, it was confirmed that the higher conversion efficiency was obtained in comparison with the case of being set as a substituent having a ring or branch structure other than a tertiary butyl group and a benzyl group. Also, it was confirmed that when an anchor group was a carboxylic acid group, the conversion efficiency was improved, and when at least one of R15 and R16 was set as a group having an anchor group, the higher conversion efficiency was obtained. Further, it was confirmed that y indicated in Chemical Formula 2 was preferably from 0 to 3, and especially when y was from 0 to 2, the higher conversion efficiency was obtained.

From these, the following were confirmed. The conversion efficiency was improved in the dye-sensitized solar cell when the dye 14 included the compound having an anchor group and indicated in Chemical Formula 2. Especially, the higher conversion efficiency was obtained when zinc oxide was used as material of the metal oxide semiconductor of the working electrode 10.

Also, in the case that the compound indicated in Chemical Formula 3 was used as the dye, the results similar to the results shown in Table 1 were obtained. That is, in example 2-2 where the dye 14 included the compound indicated in Chemical Formula 15, it was confirmed that the conversion efficiency was improved in comparison with comparative examples 1-1 and 1-2 where the dye 14 included no such compound. From these results, when the compound indicated in Chemical Formula 3 had a halogen group as R30, and had a ring structure with R29 of a ring structure and with a methine chain as a part of the ring, crystallization of the dye 14 on the surface of the carrier could be efficiently suppressed in the case of a substituent having a ring structure in comparison with the case of a substituent having a branch structure.

Although it was not indicated in the embodiments, when at least one selected from the group consisting of R21 to R24 indicated in Chemical Formula 3 was set as a benzyl group, it was confirmed that the higher conversion efficiency was obtained in comparison with the case of being set as a substituent having a ring structure other than a benzyl group. Also, it was confirmed that when an anchor group was a carboxylic acid group, the conversion efficiency was improved, and when at least one of R25 and R26 was set as a group having an anchor group, the higher conversion efficiency was obtained. Further, it was confirmed that q indicated in Chemical Formula 3 was preferably from 1 to 3, and especially when q was from 1 to 2, the higher conversion efficiency was obtained.

From these, the following were confirmed. The conversion efficiency was improved in the dye-sensitized solar cell when the dye 14 included the compound having an anchor group and indicated in Chemical Formula 3. Especially, the higher conversion efficiency was obtained when zinc oxide was used as material of the metal oxide semiconductor of the working electrode 10.

Hereinbefore, the present invention was described with the embodiment and the examples. However, the present invention is not limited to those embodiment and examples, as various modifications are available. For example, the use of the photoelectric conversion device of the present invention is not necessarily limited as described before, and the other use is also possible. For example, as the other use, there is given a light sensor.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion device comprising:
   a dye; and
   an electrode having a carrier carrying the dye,
   wherein the dye includes a compound having an anchor group and represented by Chemical Formula 1:

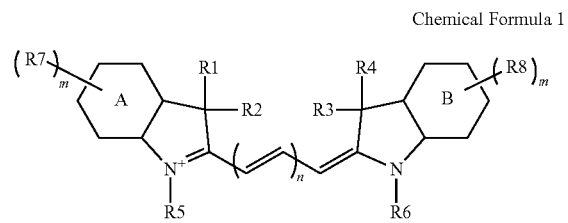

Chemical Formula 1 wherein R1, R2, R3, R4, R5, R6, R7, and R8 are substituents;
Ring A and Ring B are benzene rings or naphthalene rings;
at least one selected from the group consisting of R1, R2, R3, R4, R5, R6, R7, and R8 is a substituent having a ring or branch structure;
m and n are integers of 0 or more, and
the substituent having a ring or branch structure is a benzyl group, a derivative of a benzyl group, or a tertiary butyl group, wherein at least one selected from the group consisting of R1, R2, R3, and R4 indicated in Chemical Formula 1 is the substituent having a ring or branch structure.

2. The photoelectric conversion device according to claim 1,
   wherein the anchor group is a carboxyl group.

3. The photoelectric conversion device according to claim 1,
   wherein at least one of R5 and R6 indicated in Chemical Formula 1 is a group having the anchor group.

4. The photoelectric conversion device according to claim 1,
   wherein the indicated in Chemical Formula 1 is 3 or less.

5. The photoelectric conversion device according to claim 1,
   wherein the carrier includes at least one of zinc oxide and titanium oxide.

6. A photoelectric conversion device comprising:
a dye; and
an electrode having a carrier carrying the dye,
wherein the dye includes a compound having an anchor group and represented by Chemical Formula 1:

Chemical Formula 1

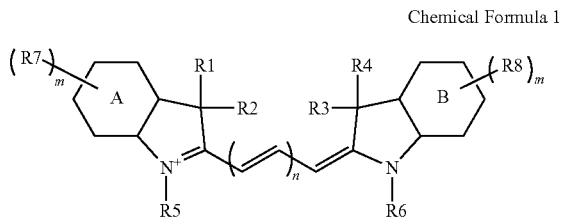

wherein R1, R2, R3, R4, R5, R6, R7, and R8 are substituents;
Ring A and Ring B are benzene rings or naphthalene rings;
at least one selected from the group consisting of R1, R2, R3, R4, R5, R6, R7, and R8 is a substituent having a ring or branch structure;
m and n are integers of 0 or more, and
the substituent having a ring or branch structure is a benzyl group, a derivative of a benzyl group, or a tertiary butyl group, wherein Ring A is a benzene ring and Ring B is a naphthalene ring.

7. A photoelectric conversion device comprising:
a dye; and
an electrode having a carrier carrying the dye,
wherein the dye includes a compound having an anchor group and represented by Chemical Formula 1:

Chemical Formula 1

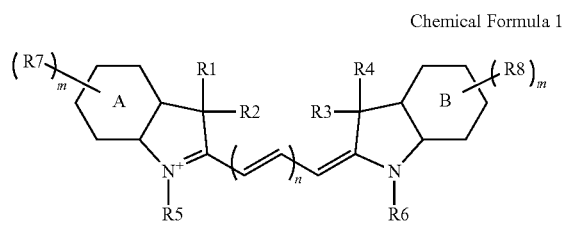

wherein R1, R2, R3, R4, R5, R6, R7, and R8 are substituents;
Ring A and Ring B are benzene rings or naphthalene rings;
at least one selected from the group consisting of R1, R2, R3, R4, R5, R6, R7, and R8 is a substituent having a ring or branch structure;
m and n are integers of 0 or more, and
the substituent having a ring or branch structure is a benzyl group, a derivative of a benzyl group, or a tertiary butyl group, wherein Ring A is a naphthalene ring and Ring B is a benzene ring.

* * * * *